US011302942B2

(12) United States Patent
Chaudron et al.

(10) Patent No.: US 11,302,942 B2
(45) Date of Patent: Apr. 12, 2022

(54) METHOD FOR DETECTING LEAKAGE OF A REDUCING FLUID THROUGHOUT AN ELECTROLYTE MEMBRANE OF AN ELECTROCHEMICAL CELL

(71) Applicant: AREVA Stockage d'Energie, Aix en Provence (FR)

(72) Inventors: Valery Chaudron, Manosque (FR); André Rakotondrainibe, Aix en Provence (FR)

(73) Assignee: AREVA STOCKAGE D'ENERGIE, Aix en Provence (FR)

( * ) Notice: Subject to any disclaimer, the term of this patent is extended or adjusted under 35 U.S.C. 154(b) by 715 days.

(21) Appl. No.: 14/763,579

(22) PCT Filed: Dec. 10, 2013

(86) PCT No.: PCT/EP2013/076126
§ 371 (c)(1),
(2) Date: Jul. 27, 2015

(87) PCT Pub. No.: WO2014/117893
PCT Pub. Date: Aug. 7, 2014

(65) Prior Publication Data
US 2015/0357661 A1 Dec. 10, 2015

(30) Foreign Application Priority Data
Jan. 30, 2013 (FR) ...................... 1350793

(51) Int. Cl.
*H01M 8/04* (2016.01)
*H01M 8/24* (2016.01)
(Continued)

(52) U.S. Cl.
CPC ......... *H01M 8/04671* (2013.01); *G01M 3/00* (2013.01); *G01M 3/20* (2013.01);
(Continued)

(58) Field of Classification Search
None
See application file for complete search history.

(56) References Cited

U.S. PATENT DOCUMENTS

| 5,763,113 | A | 6/1998 | Meltser et al. |
| 2009/0226773 | A1* | 9/2009 | Takekawa ......... H01M 8/04007 |
| | | | 429/513 |

FOREIGN PATENT DOCUMENTS

| EP | 0 827 226 A2 | 3/1998 | |
| EP | 0827226 | * 3/1998 | .............. H01M 8/04 |

(Continued)

OTHER PUBLICATIONS

Search Report for corresponding International Application PCT/EP2013/076126.

*Primary Examiner* — Barbara L Gilliam
*Assistant Examiner* — Angela J Martin
(74) *Attorney, Agent, or Firm* — Davidson, Davidson & Kappel, LLC

(57) ABSTRACT

A method for detecting leakage of a reducing fluid throughout an electrolyte membrane of an electrochemical cell is provided. The method includes the following consecutive steps: supplying the cell with anode and cathode streams; brisk and controlled variation of at least one of the following parameters: the pressure of the anode stream in the anode channel, the pressure of the cathode stream in the cathode channel, the flow rate of the anode stream into the anode channel, the flow rate of the cathode stream into the cathode channel, and the strength of the current exchanged between the two sides of the membrane; measurement of a first reducing fluid concentration in a first stream, including the cathode stream leaving the cathode channel; and deducing the presence or absence of leakage on the basis of the variation in the first measured concentration of reducing (Continued)

fluid over time. A corresponding fuel cell system is also provided.

12 Claims, 7 Drawing Sheets

(51) Int. Cl.
| | |
|---|---|
| *G01M 3/00* | (2006.01) |
| *G01M 3/20* | (2006.01) |
| *H01M 8/04664* | (2016.01) |
| *H01M 8/0438* | (2016.01) |
| *G01R 31/385* | (2019.01) |
| *H01M 8/0444* | (2016.01) |
| *H01M 8/04089* | (2016.01) |
| *H01M 8/04746* | (2016.01) |
| *H01M 8/04858* | (2016.01) |
| *H01M 8/249* | (2016.01) |
| *H01M 8/10* | (2016.01) |
| *H01M 8/04082* | (2016.01) |

(52) U.S. Cl.
CPC ........ *G01R 31/385* (2019.01); *H01M 8/0447* (2013.01); *H01M 8/04097* (2013.01); *H01M 8/04388* (2013.01); *H01M 8/04395* (2013.01); *H01M 8/04679* (2013.01); *H01M 8/04753* (2013.01); *H01M 8/04902* (2013.01); *H01M 8/249* (2013.01); *H01M 8/04197* (2016.02); *H01M 2008/1095* (2013.01)

(56) References Cited

FOREIGN PATENT DOCUMENTS

| | | | | |
|---|---|---|---|---|
| EP | 1942541 | | 7/2008 | |
| JP | H03101061 | A | 4/1991 | |
| JP | H07169488 | A | 7/1995 | |
| JP | H11 67255 | A | 3/1999 | |
| JP | 2005-150007 | A * | 6/2005 | ............. H01M 8/04 |
| JP | 2005150007 | A | 6/2005 | |
| JP | 2006-339080 | A * | 12/2006 | ............. H01M 8/04 |
| JP | A2006339080 | | 12/2006 | |
| JP | 2007-048540 | A * | 2/2007 | ............. H01M 8/04 |
| JP | 2007048540 | A | 2/2007 | |
| JP | 2007059120 | A | 3/2007 | |
| JP | A2007157544 | | 6/2007 | |
| WO | WO 2004/027369 | A2 | 4/2004 | |

* cited by examiner

METHOD FOR DETECTING LEAKAGE OF A REDUCING FLUID THROUGHOUT AN ELECTROLYTE MEMBRANE OF AN ELECTROCHEMICAL CELL

The present invention relates to a method for detecting leakage of a reducing fluid throughout an electrolyte membrane of an electrochemical cell, the membrane being interposed between an anode channel for the flow of an anode stream, comprising the reducing fluid, along a first side of the membrane, and a cathode channel for the flow of a cathode stream, comprising the oxidizing fluid, along a second side of the membrane, the electrochemical cell comprising means for the flow of electric current between the two sides of the membrane.

This electrochemical cell is for example part of a stack of electrochemical cells of a fuel cell system.

BACKGROUND

Fuel cell systems are known comprising stacks of electrochemical cells each comprising a cathode channel, an anode channel, and an electrolyte membrane interposed between the two channels. The electrolyte membrane is designed to serve as a barrier between a reducing fluid flowing in the anode channel and an oxidizing fluid flowing in the cathode channel. The electrolyte membrane is nevertheless suitable for being crossed through by protons, so as to allow the occurrence of an oxidation-reduction reaction in the electrochemical cell between the reducing fluid and the oxidizing fluid.

This oxidizing-reducing reaction generates an electric current that is collected at the ends of each stack, and is used to supply a charge.

However, the electrolyte membranes of the cells are generally not perfectly tight with respect to the reducing fluid, and that tightness tends to decrease as the membrane ages. It was thus observed, in the known fuel cell systems, that after a certain operating time of each system, the electrolyte membranes of certain cells of the system were becoming permeable to the reducing fluid, which was causing a significant decrease in the performance of the fuel cell system. For example, for a proton exchange membrane (PEM) of the Nafion 112 type having a thickness of approximately 50 µm, the tightness level is considered abnormal when the so-called "crossover" current, i.e., the permeation current of the hydrogen from the anode channel toward the cathode channel, becomes greater than an equivalent current of $1 \text{ mA/cm}^2$.

As a general rule, the loss of sealing of the electrolyte membrane is very disparate and only affects certain cells of the fuel cell system. It is therefore desirable to be able to identify the relevant cells, so as to be able to replace them. To that end, leakage detection methods have been developed in which the voltage across the terminals of each cell of the fuel cell system is monitored, so as to identify the voltage drops across the terminals of the cells.

However, a voltage drop across the terminals of a cell may have causes other than the mere loss of sealing of the membrane, for example fluid swelling of the cell by water accumulation in the anode or cathode channel, or local drying of the membrane of the cell, or a short-circuit phenomenon across the terminals of the cell.

Furthermore, a significant loss of tightness at the cell does not systematically lead to a drop in the voltage of the cell.

To eliminate this ambiguity, a method has been developed for detecting a leak in which the monitoring of the voltage across the terminals of the cells of the fuel cell system is coupled to a measurement of the reducing fluid concentration in the outgoing stream of a cathode collector of a stack of cells, said collector collecting the streams exiting the cathode channels of all of the cells of the stack. Thus, if a voltage drop across the terminals of a cell from the stack is observed at the same time as an increase in the measured concentration of reducing fluid, it is deduced that the voltage drop is originating from a loss of tightness of the electrolyte membrane of the cell.

Such a method is known from U.S. Pat. No. 5,763,113.

SUMMARY OF THE INVENTION

However, this method does not make it possible to identify small variations in the permeability of the membranes of the cells in the stack. Furthermore, this method requires keeping voltage sensors to measure the voltage across the terminals of each cell, which makes the fuel cell system expensive and complex.

One aim of the invention is to provide a method suitable for identifying small variations in the permeability of the electrolyte membrane. Another aim is for this method to be able to be implemented on a simple and cost-effective fuel cell system.

To that end, a method of the aforementioned type is provided, comprising the following successive steps:
supplying the cell with anode and cathode streams, the anode stream being at a first pressure and flowing at a first flow rate in the anode channel, the cathode stream being at a second pressure and flowing at a second flow rate in the cathode channel, and a current with a first intensity being exchanged between the two sides of the membrane,
varying at least one parameter briskly and in a controlled manner, said parameter being chosen from among the following parameters:
pressure of the anode stream in the anode channel,
pressure of the cathode stream in the cathode channel,
flow rate of the anode stream in the anode channel,
flow rate of the cathode stream in the cathode channel, and
intensity of the current exchanged between the two sides of the membrane,
measuring a first concentration of reducing fluid in a first stream comprising the cathode stream leaving the cathode channel, and
deducing the presence or absence of a leakage based on the evolution over time of the first measured concentration of reducing fluid.

According to preferred embodiments of the invention, the method also has one or more of the following features, considered alone or according to any technically possible combination(s):
the first stream consists in of the cathode stream leaving the cathode channel;
the electrochemical cell is part of a stack of a plurality of electrochemical cells, the cathode stream leaving each of said electrochemical cells being collected in a cathode collector shared by the electrochemical cells, the first stream being a stream flowing at a first measuring point of said cathode collector;
said detection method comprises the following additional steps:
measuring a second reducing fluid concentration in a second stream flowing at a second measuring point of the cathode collector, comparing the first and second measured reducing fluid concentrations to one another, and locating the leakage among the cells of the stack depending on the variation over time of one of said first and second measured concentrations relative to one another.

the second measuring point is positioned upstream from the cell in which the leakage is detected, relative to a fluid flow direction in the cathode collector;

the stack of electrochemical cells is part of a fuel cell system comprising the stack, a multi-channel valve and a dihydrogen sensor, the method comprising the following additional steps:

placing a first inlet channel of the multi-channel valve, fluidly connected to the first measuring point, in fluid communication with an outlet channel of the multi-channel valve, fluidly connected to the dihydrogen sensor, then measuring the first concentration of reducing fluid using the dihydrogen sensor.

said detection method comprises the following additional steps:

placing a second inlet channel of the multi-channel valve, fluidly connected to the second measuring point, in fluid communication with the outlet valve of the multi-channel valve, then measuring the second reducing fluid concentration using the dihydrogen sensor.

the fuel cell system comprises a second stack of electrochemical cells, the method comprising the following additional steps:

placing a third inlet channel of the multi-channel valve, fluidly connected to a cathode collector of the second stack, in fluid communication with the outlet channel of the multi-channel valve, then measuring, using the dihydrogen sensor, a third reducing fluid concentration in a third stream flowing in the cathode collector of the second stack;

the brisk variation of the flow rate of the cathode stream in the cathode channel is obtained by reinjecting part of the exiting cathode stream at the inlet of the cathode channel;

during the brisk variation step, at least two of the parameters vary simultaneously or sequentially.

The invention also relates to a fuel cell system, comprising at least one electrochemical cell, the or each electrochemical cell comprising:

an electrolyte membrane, an anode channel for the flow of an anode stream, comprising a reducing fluid, along a first side of the membrane, a cathode channel for the flow of a cathode stream, comprising the oxidizing fluid, along a second side of the membrane, means for the flow of an electric current between the two sides of the membrane, means for supplying the or each cell with anode and cathode streams, the anode stream being at a first pressure and flowing at a first flow rate in the anode channel, the cathode stream flowing at a second flow rate in the cathode channel, means for controlling at least one parameter from among the following parameters:

pressure of the anode stream in the anode channel of the or each cell, pressure of the cathode stream in the cathode channel of the or each cell, flow rate of the anode stream in the anode channel of the or each cell, flow rate of the cathode stream in the cathode channel of the or each cell, and intensity of the current exchanged between the two sides of the membrane of the or each cell, at least one sensor, to measure a first reducing fluid concentration in a first stream comprising the cathode stream leaving from the cathode channel of the or at least one of the electrochemical cell(s), and means for detecting a leakage of reducing fluid through the electrolyte membrane of the or one of the electrochemical cell(s), depending on the evolution over time of the first measured concentration of reducing fluid.

According to preferred embodiments of the invention, the fuel cell system also has one or more of the following features, considered alone or according to any technically possible combination(s):

said fuel cell system comprises a plurality of electrochemical cells grouped together within a first stack, said first stack comprising a first cathode collector, to collect the cathode stream leaving the cathode channel of each electrochemical cell of the stack, the first stream being a stream flowing at a first measuring point of said cathode collector;

said fuel cell system comprises a multi-channel valve to place the sensor in fluid communication selectively with the first measuring point, or with a second measuring point of the first cathode collector;

said fuel cell system comprises a second stack of electrochemical cells with a second cathode collector, and a multi-channel valve to place the sensor in fluid communication selectively with the first measuring point or with the third measuring point of the second cathode collector; and said fuel cell system comprises a device for reinjecting part of the cathode stream leaving the or each electrochemical cell at the inlet of the cathode channel of the or each electrochemical cell.

BRIEF SUMMARY OF THE DRAWINGS

Other features and advantages of the invention will appear upon reading the following description, provided solely as an example and done in reference to the appended drawings, in which.

DETAILED DESCRIPTION

Figure 1:
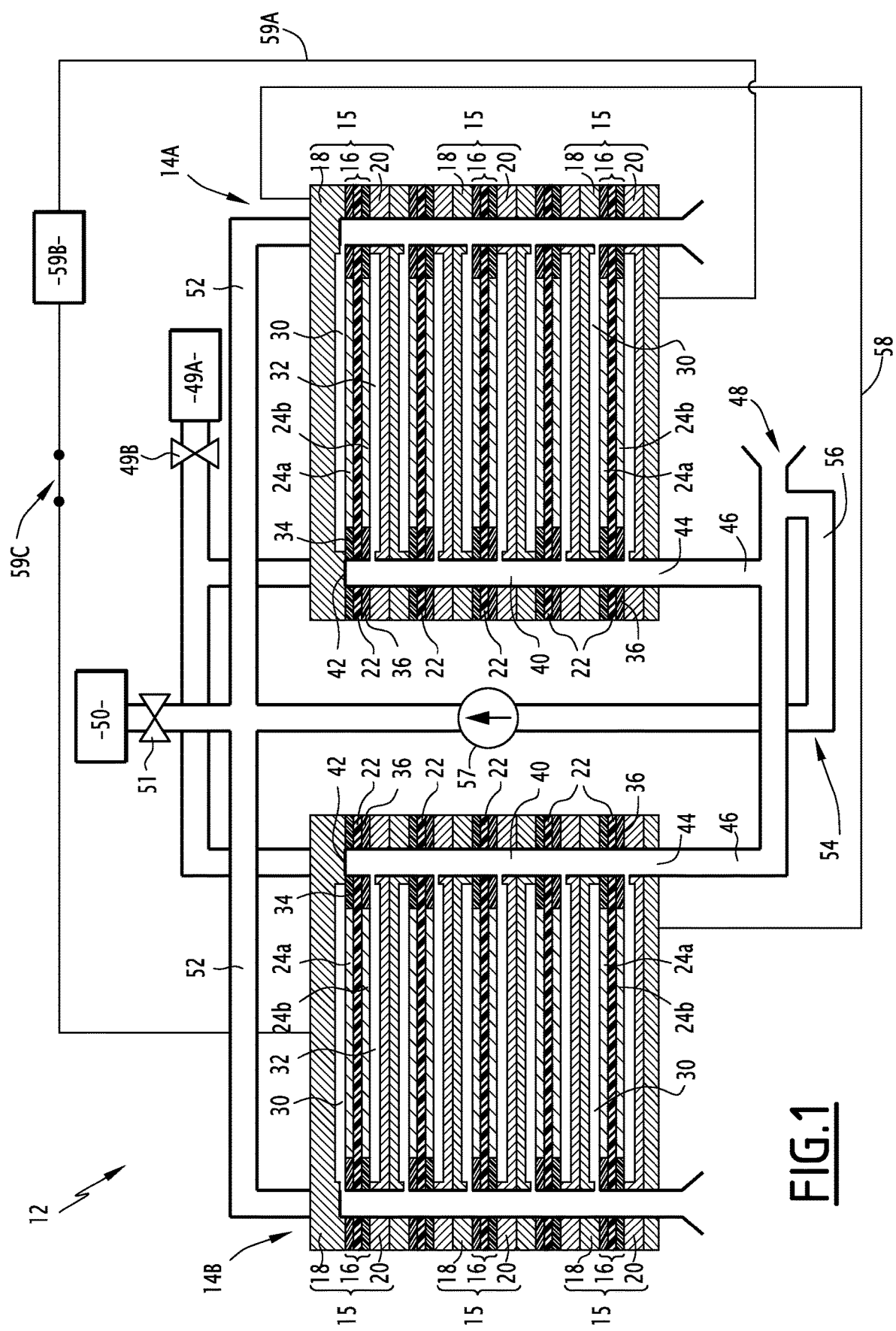
FIG. 1 is a diagrammatic sectional illustration of a fuel cell system according to a first embodiment of the invention.

The fuel cell system 12, shown in FIGS. 1, 3, 4 and 5, is suitable for producing an electric current through an oxidation-reduction reaction between an oxidizing fluid and a reducing fluid. To that end, it comprises two stacks 14A, 14B of electrochemical cells 15, stacked in a longitudinal stacking direction.

It will be noted that this number of two stacks 14A, 14B is purely arbitrary, and that the fuel cell system 12 may comprise any number of stacks 14A, 14B, without going beyond the scope of the invention.

Likewise, although in the illustrated example each stack 14A, 14B comprises five cells 15, this number is purely arbitrary. Alternatively, the number of cells 15 per stack 14A, 14B is less than or greater than five.

Each cell 15 comprises a membrane-electrode assembly 16 inserted in the longitudinal direction between an anode conductive plate 18 and a cathode conductive plate 20.

The membrane-electrode assembly 16 comprises an electrolyte membrane 22 sandwiched in the longitudinal direction between an anode 24a and a cathode 24b.

The membrane 22 separates the oxidizing and reducing fluids.

The membrane 22 is generally a proton-conducting membrane, suitable for only allowing protons to cross through it. In particular, the membrane 22 forms a barrier to free electrons. Thus, it electrically isolates the anode 24a from the cathode 24b, and the anode plate 18 from the cathode plate 20.

The membrane 22 is typically made from a polymer material.

The anode 24a and the cathode 24b each comprise a catalyzer, typically made from platinum or a platinum alloy, to facilitate the reaction. They are positioned together on either side of the membrane 22, and together define an active zone of the cell 15 where the electrochemical oxidizing-reducing reaction occurs.

The anode plate 18 delimits an anode channel 30 for the flow of an anode stream, comprising the reducing fluid, along and in contact with the anode 24a. To that end, the plate 18 is provided with at least one channel arranged in the face of the plate 18 turned toward the membrane-electrode assembly 16 and closed by said membrane-electrode assembly 16. The anode plate 18 is formed from an electrically conductive material, typically a composite made up of a graphite-filled polymer. The reducing fluid is for example dihydrogen.

The cathode plate 20 delimits a cathode channel 32 for the flow of a cathode stream comprising the oxidizing fluid along and in contact with the cathode 24b. To that end, the plate 20 is provided with at least one channel arranged in the face of the plate 20 facing the membrane-electrode assembly 16 and closed by said membrane-electrode assembly 16. The cathode plate 20 is formed by an electrically conductive material, typically a composite made up of a graphite-filled polymer. The oxidizing fluid is for example dioxygen.

The anode 24 is in electric contact with the anode plate 18. The cathode 24b is in electric contact with the cathode plate 20. The oxidation of the reducing fluid occurs and the electrons and protons are generated at the anode 24a. The electrons next pass through the anode plate 18 toward the cathode 24b of an adjacent cell 15, to participate in the reduction of the oxidizing fluid in the adjacent cell 15.

In each stack 14A, 14B, the anode plate 18 of each cell 15 of the stack 14A, 14B is in contact with the cathode plate 20 of the adjacent cell 15. The conductive plates 18, 20 thus ensure the transfer of electrons from the reducing fluid flowing in one of the cells 15 of the stack 14A, 14B to the oxidizing fluid flowing in another cell 15 of the stack 14A, 14B. Preferably, a channel (not shown) for the flow of a cooling fluid is formed at the interface between the anode 18 and cathode 20 plates.

Alternatively, the anode 18 and cathode 20 plates of two adjacent cells 15 of the stack 14A, 14B are integral and together form a bipolar plate.

The cell 15 further comprises seals 34, 36 to provide tightness between the conductive plates 18, 20 on the one hand and the membrane-electrode assembly 16 on the other hand. A first seal 34 is inserted in the longitudinal direction between the anode conductive plate 18 and the membrane 22, and a second seal 36 is inserted in the longitudinal direction between the cathode conductive plate 20 and the membrane 22, at the first seal 34. Each seal 34, 36, respectively, extends from the anode 24a, the cathode 24b, respectively.

The cells 15 are kept stacked owing to two gripping plates (not shown) positioned at the longitudinal ends of the stack 14A, 14B. Tightening bolts (not shown) exert a tightening force on said plates to keep them compressed against the cells 15.

The cathode channel 32 of each cell 15 of each stack 14A, 14B emerges in a cathode outlet collector 40 of the stack 14A, 14B. The cathode outlet collector 40 is suitable for collecting the cathode stream leaving each cell 15 of the stack 14A, 14B.

The cathode outlet collector 40 extends in the longitudinal direction of the stacks 14A, 14B. It is closed at a longitudinal end 42, and emerges by an opposite longitudinal end 44 in a discharge channel 46 of the cathode streams leaving the stack 14A, 14B.

The discharge channel 46 fluidly connects the cathode outlet collector 40 to a vent 48. In the illustrated example, the vent 48 is shared by the two stacks 14A, 14B.

The fuel cell system 12 also comprises a supply source 49A for supplying each cell 15 with reducing fluid, a valve 49B for regulating the flow rate and the supply pressure of the reducing fluid, a source 50 for supplying each cell 15 with oxidizing fluid, and a valve 51 for regulating the flow rate and the supply pressure of oxidizing fluid.

The supply source 49A is typically a reducing fluid reservoir.

The supply source 50 is typically an air compressor or an oxidizing fluid reservoir.

The fuel cell system 12 also comprises two channels 52 for supplying oxidizing fluid, each specific to a respective stack 14A, 14B. Each supply channel 52 fluidly connects the supply source 50 to a cathode inlet collector 53 (FIG. 2) of the respective stack 14A, 14B.

The cathode inlet collector 53 fluidly communicates with the cathode channel 32 of each cell 15 of the stack 14A, 14B, and is suitable for supplying said cathode channel 32 with oxidizing fluid.

The fuel cell system 12 additionally comprises a recirculation device 54 for the cathode stream. The device 54 is suitable for removing part of the cathode streams leaving each stack 14A, 14B, and reinjecting it at the inlet of each stack 14A, 14B.

To that end, the reinjection device 54 comprises a reinjection channel 56, fluidly connecting the vent 48 to each supply channel 52, and a pump 57, to force the flow of fluid in the channel 56 from the vent 48 toward each supply channel 52.

Figure 5:
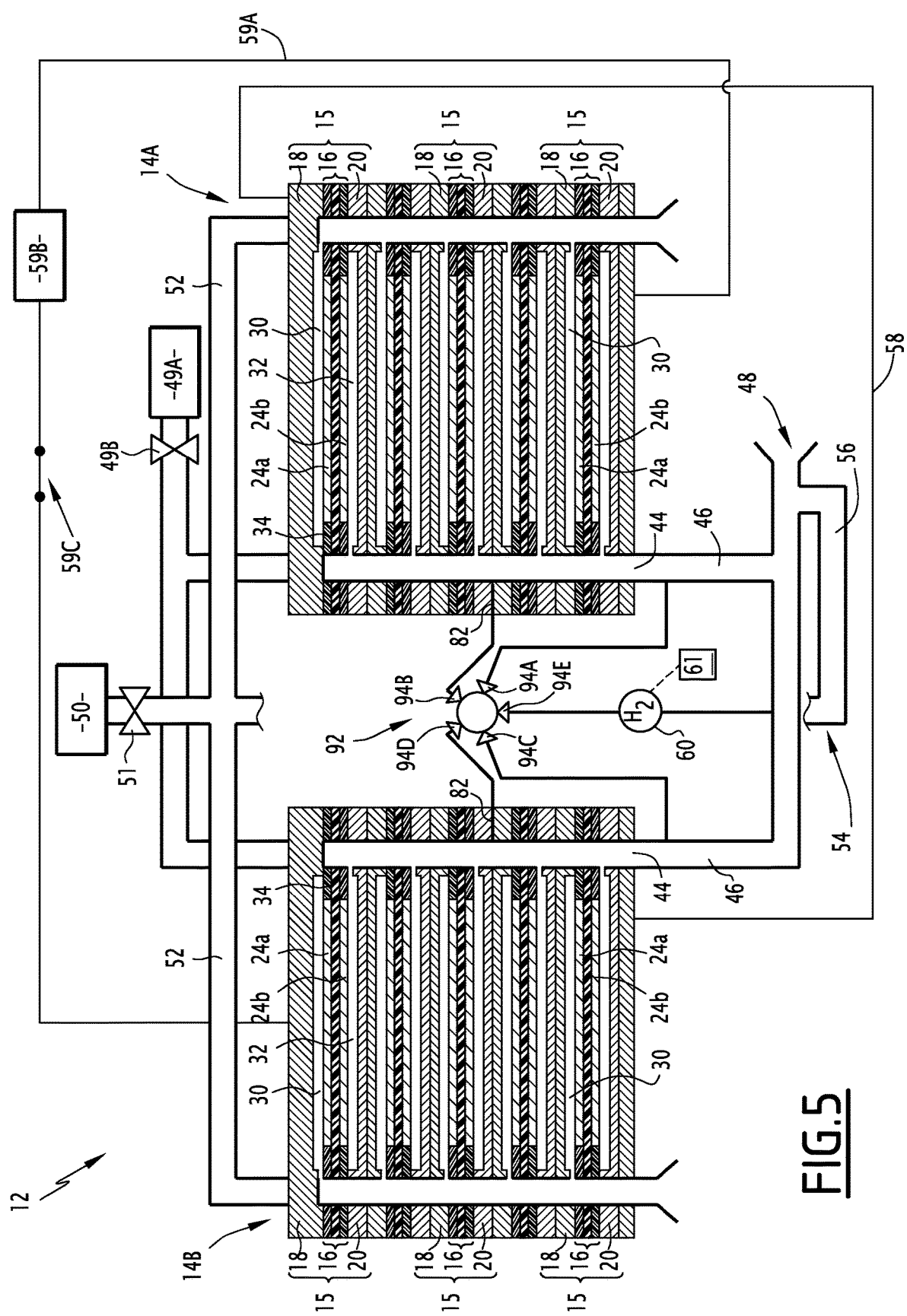
FIG. 5 is a diagrammatic sectional view of a fuel cell system according to a fourth embodiment of the invention.

It will be noted that in FIG. 5, part of the reinjection device 54 has been omitted for clarity reasons.

The stacks 14A, 14B are electrically connected to one another in series using a first electrical connection 58. A second electrical connection 59A electrically connects the stacks 14A, 14B to a charge 59B. A switch 59C, on the line 59A, is suitable for selectively connecting or disconnecting the charge 59B with respect to the stacks 14A, 14B.

The fuel cell system 12 is suitable for generating a nominal charge current in the second electrical connection 59A when:
- the switch 59C is closed,
- the pressure of the cathode stream in each cathode channel 32 is equal to a nominal cathode pressure,
- the pressure of the anode stream in each anode channel 30 is equal to a nominal anode pressure,
- the flow rate of the cathode stream in each cathode channel 32 is equal to a nominal cathode flow rate, and
- the flow rate of the anode stream in each anode channel 30 is equal to a nominal anode flow rate.

The fuel cell system 12 lastly comprises a first sensor 60 (FIG. 2), to measure a first concentration $C_1$ of reducing fluid in a first stream comprising the cathode stream leaving at least one cell 15 of the system 12.

The first sensor 60 is suitable for communicating with a leakage detection module 61, suitable for deducing the presence of leakage in a cell 15 of the system 12, when the first concentration C1 exceeds a threshold concentration.

Figure 2:
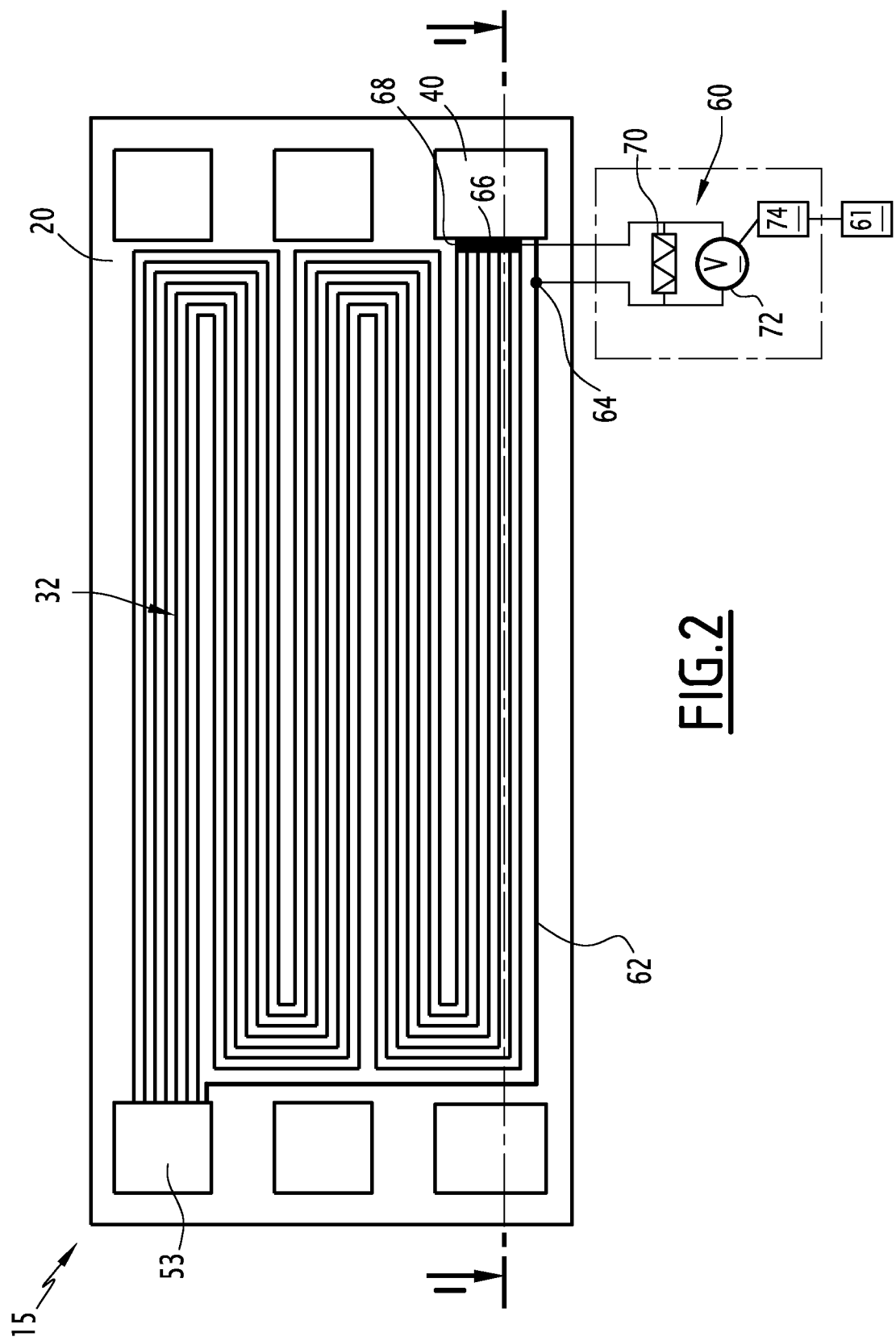
FIG. 2 is a diagrammatic sectional view of the electrochemical cell of the system of FIG. 1, in which the cutting plane of FIG. 1 is embodied by reference I.

In the first version shown in FIGS. 1 and 2, the first stream is made up of the cathode stream leaving a cell 15 of the system 12.

To that end, said cell 15 comprises, in reference to FIG. 2, a cathode bypass channel 62, bypassing the cathode channel 32. The bypass channel 62 thus fluidly connects the inlet collector 51 to the outlet collector 40, without crossing to the active zone of the cell 15. The oxidizing fluid flowing in that channel 62 is not reduced.

The bypass channel 62 is suitable for the fluid flowing inside to have a lower flow rate than the fluid flowing in the cathode channel 32.

The first sensor 60 comprises a first electrode 64, positioned in the bypass channel 62, and a second electrode 66, positioned in a connecting zone 68 connecting the cathode channel 32 to the outlet collector 40. It also comprises a resistance 70, electrically connected by one terminal to the first electrode 64, and by the other of its terminals to the second electrode 66. It lastly comprises a filter 72, to measure a voltage across the terminals of the resistance 70, and a module 74 for deducing the concentration $C_1$ as a function of the voltage measured by the filter 72.

Still in this first alternative, each other cell 15 of the fuel cell system 12 also comprises a cathode bypass channel similar to the cathode bypass channel 62, and the sensor, identical to the first sensor 60, is associated with each of these other cells 15 to measure a reducing fluid concentration in the cathode stream leaving said cell 15.

The first sensor 60 and the other sensors are suitable for communicating with the leakage detection module 61, which is suitable for deducing the presence of a leakage in a cell 15 of the system 12 when the reducing fluid concentration measured by the sensor associated with said cell 15 exceeds a threshold concentration.

Thus, it is possible to detect, for each cell 15, whether an abnormal elevation of the reducing fluid concentration in the cathode stream leaving said cell 15 is occurring. It is therefore easily possible to identify a loss of tightness of the membrane 22 of a cell 15, and to ensure very precise monitoring of the aging of the membrane 22 of each cell 15.

However, such a solution is expensive, inasmuch as it requires integrating a sensor in each cell 15 of each stack 14A, 14B. Furthermore, such a solution is complex, inasmuch as it requires managing a large number of reducing fluid sensors to monitor the cells 15.

Figure 3:
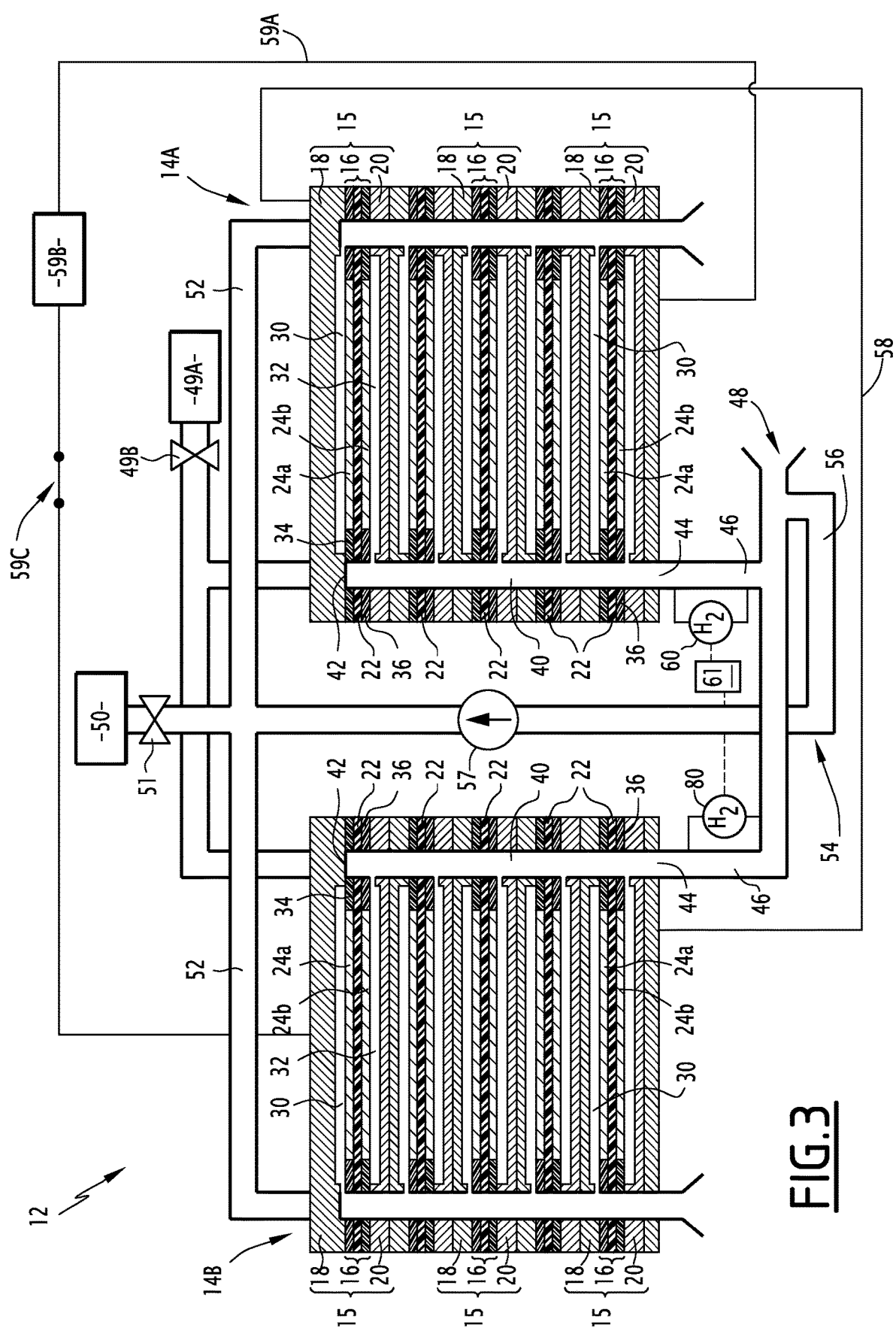
FIG. 3 is a diagrammatic sectional view of a fuel cell system according to a second embodiment of the invention.
Figure 4:
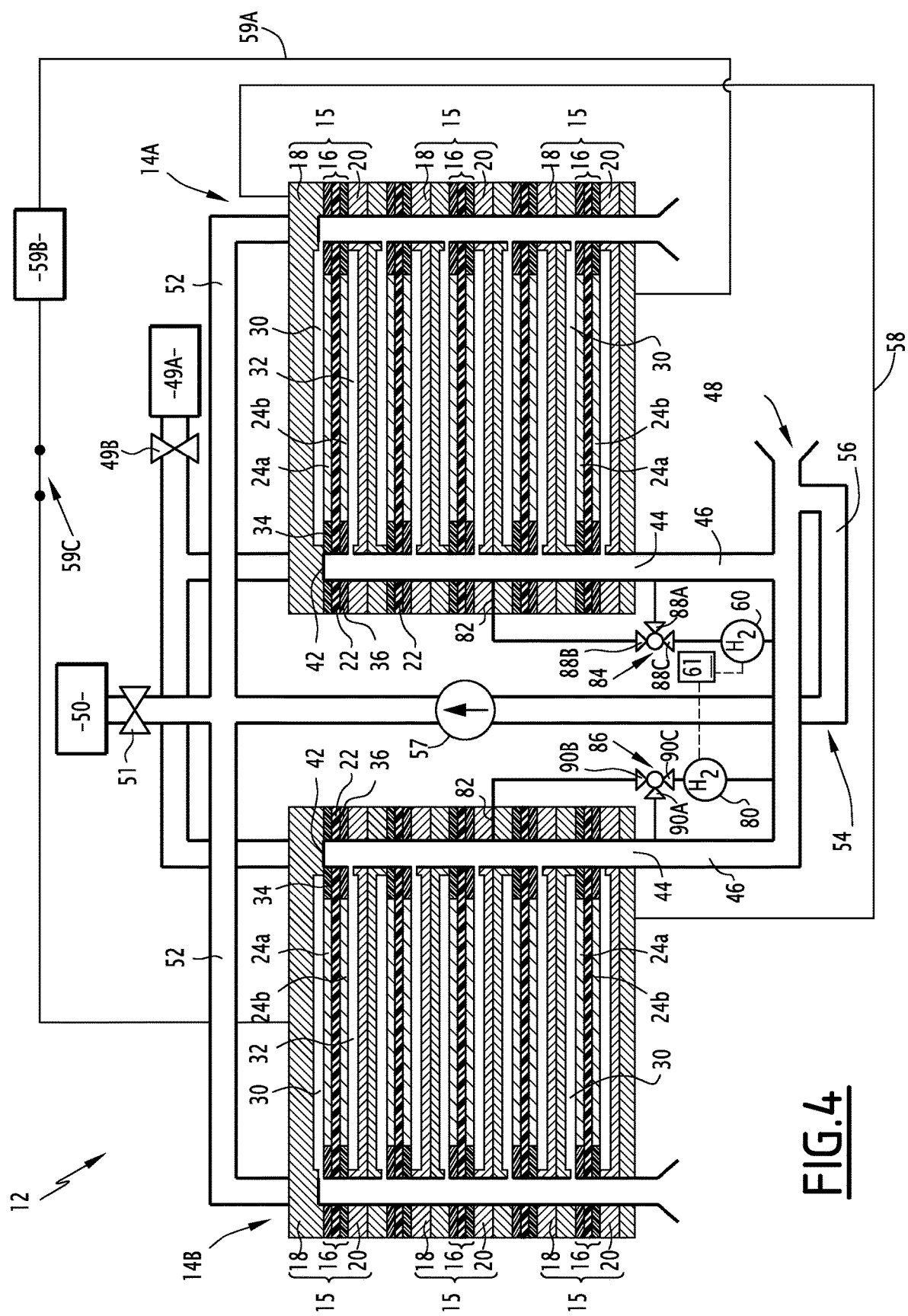
FIG. 4 is a diagrammatic sectional view of a fuel cell system according to a third embodiment of the invention.

In the second, third and fourth alternatives, shown in FIGS. 3 to 5, the first stream is a stream flowing at a first measuring point of the cathode outlet collector 40 of a first 14A of the stacks 14A, 14B, the first measuring point being made up of the emerging end 44 of the cathode outlet collector 40. The first stream is therefore the stream leaving the cathode outlet collector 40.

In the second and third alternatives, shown in FIGS. 3 and 4, the fuel cell system 12 also comprises a second sensor 80, to measure a second reducing fluid concentration $C_2$, in a second stream comprising the cathode stream leaving at least one cell 15 of the second stack 14B. The second stream is in particular a stream flowing at a first measuring point of the cathode outlet collector 40 of the second stack 14B, said first measuring point being the emerging end 44 of said cathode outlet collector 40. The second stream is thus the stream leaving the second cathode outlet collector 40 of the second stack 14B.

The second sensor 80 is also suitable for communicating with the detection module 61.

In the second alternative, shown in FIG. 3, the first sensor 60 is suitable for measuring only the first concentration $C_1$, and the second sensor 80 is suitable for measuring only the second concentration $C_2$.

The detection module 61 is suitable for comparing the first concentration $C_1$ to the second concentration $C_2$, and for deducing the presence of a leakage in one of the stacks 14A, 14B when one of the following conditions is met:
- the difference between the concentrations $C_1$ and $C_2$ exceeds a predetermined threshold, or
- the deviation relative to time of the difference between the concentrations $C_1$ and $C_2$ exceeds a predetermined threshold.

The detection module 61 is suitable for locating the leakage in the stack 14A, 14B associated with the sensor 60, 80 having measured the highest concentrations $C_1$, $C_2$, or having the largest deviation relative to time.

The detection module 61 is also suitable for locating the leakage among the cells 15 of said stack 14A, 14B as a function of the delay between a moment $t_0$ (FIG. 6) of brisk variation of a parameter from among the following parameters:
- pressure of the anode stream in the anode channel 30 of the or each cell 15,
- pressure of the cathode stream in the cathode channel 32 of the or each cell 15,
- flow rate of the anode stream in the anode channel 30 of the or each cell 15,
- flow rate of the cathode stream in the cathode channel 32 of the or each cell 15, and
- intensity of the current exchanged between the two sides of the membrane 22 of the or each cell 15, and a moment $t_1$ (FIG. 6) of significant variation of the measured concentrations $C_1$, $C_2$.

"Brisk variation" means that, over a length of time greater than or equal to 1 second, the deviation relative to time of the parameter in question is greater than:
- 10 mbar per second, preferably greater than 100 mbar per second or 1% of the nominal anode pressure per second, for the pressure of the anode stream
- 10 mbar per second, and preferably greater than 100 mbar per second or 1% of the nominal cathode pressure per second, for the pressure of the cathode stream,
- 1% of the nominal anode flow rate per second, for the flow rate of the anode stream, 1% of the nominal cathode flow rate per second, for the flow rate of the cathode stream, and 1% of the nominal charge current per second, for the intensity of the current.

"Significant variation" means that the deviation relative to time of the measured concentrations $C_1$, $C_2$ is greater than 40 ppm per second, which represents 0.5% of the flammability limit of the hydrogen in the oxygen.

In the third alternative, shown in FIG. 4, the first sensor 60 is suitable for measuring a third reducing fluid concentration $C_3$, in a third stream flowing at a second measuring point 82 of the cathode outlet collector 40 of the first stack 14A, and the second sensor 80 is suitable for measuring a fourth reducing fluid concentrations $C_4$, in a fourth stream flowing at a second measuring point of the cathode outlet collector 40 of the second stack 14B.

Each second measuring point 82 is upstream from the corresponding first measuring point, in a fluid flow direction in the associated cathode outlet collector 40. Each second measuring point 82 is in particular positioned substantially mid-distance with respect to the longitudinal ends of the stack 14A, 14B, such that it has the same number of cells 15 of the stack 14A, 14B whereof the cathode channel 32 emerges in the cathode outlet collector 40 upstream and downstream from the second measuring point 82.

To that end, the fuel cell system 12 comprises two multi-channel valves 84, 86. A first 84 of the multi-channel valves 84, 86 comprises a first inlet 88A fluidly connected to the first measuring point of the stack 14A, a second inlet 88B fluidly connected to the second measuring point 82 of the stack 14A, and an outlet 88C fluidly connected to the sensor 60. A second 86 of the multi-channel valves 84, 86 comprises an inlet 90A fluidly connected to the first measuring point of the stack 14B, a second inlet 90B fluidly connected to the second measuring point 82 of the stack 14B and an outlet 90C fluidly connected to the sensor 80.

The detection module 61 is suitable for comparing the concentrations $C_1$, $C_2$, $C_3$, $C_4$ to one another, and deducing the presence of leakage of one of the stacks 14A, 14B when one of the following conditions is met:

the difference between two of the concentrations $C_1$, $C_2$, $C_3$, $C_4$ exceeds a predetermined threshold, or the deviation relative to time of the difference between two of the concentrations $C_1$, $C_2$, $C_3$, $C_4$ exceeds a predetermined threshold.

The detection module 61 is suitable for locating the leakage in:

the upstream half of the first stack 14A, if the difference between the concentrations $C_3$ and $C_1$ exceeds a predetermined threshold, or the deviation relative to time of said difference exceeds a predetermined threshold, the concentration $C_3$ being highest, the downstream half of the first stack 14A, if the difference between the concentrations $C_1$ and $C_3$ exceeds a predetermined threshold, or the deviation relative to time of said difference exceeds a predetermined threshold, the concentration $C_1$ being highest, the upstream half of the second stack 14B, if the difference between the concentrations $C_4$ and $C_2$ exceeds a predetermined threshold, or the deviation relative to time of said difference exceeds a predetermined threshold, the concentration $C_4$ being highest, or the downstream half of the second stack 14B, if the difference between the concentrations $C_2$ and $C_4$ exceeds a predetermined threshold, or the deviation relative to time of said difference exceeds a predetermined threshold, the concentration $C_2$ being highest.

The detection module 61 is suitable for locating the leakage among the cells 15 of the identified stack as a function of the delay between a moment $t_0$ (FIG. 6) of brisk variation of a parameter from among the following parameters:

pressure of the anode stream in the anode channel 30 of the or each cell 15, pressure of the cathode stream in the cathode channel 32 of the or each cell 15, flow rate of the anode stream in the anode channel 30 of the or each cell 15, flow rate of the cathode stream in the cathode channel 32 of the or each cell 15, and intensity of the current exchanged between the two sides of the membrane 22 of the or each cell 15, and a moment $t_1$ (FIG. 6) of significant variation of the concentration:

$C_1$, if the leakage has been detected as being in the downstream half of the first stack 14A, $C_2$, if the leakage has been detected as being in the downstream half of the second stack 14B, $C_3$, if the leakage has been detected as being in the upstream half of the first stack 14A, and $C_4$, if the leakage has been detected as being in the upstream half of the second stack 14B.

In the fourth alternative, shown in FIG. 5, the sensor 60 is suitable for measuring the concentrations $C_2$, $C_3$ and $C_4$, in addition to the concentration $C_1$. To that end, the fuel cell system 12 comprises a multi-channel valve 92, comprising:

a first inlet 94A, fluidly connected to the first measuring point of the stack 14A, a second inlet 94B fluidly connected to the second measuring point 82 of the stack 14A, a third inlet 94C, fluidly connected to the first measuring point of the stack 14B, a fourth inlet 94D, fluidly connected to the second measuring point of the stack 14B, and an outlet 94E fluidly connected to the sensor 60.

The multi-channel valve 92 is programmed to successively connect each inlet 94A, 94B, 94C, 94D to the outlet 94E, at constant time intervals.

The detection module 61 is suitable for comparing the concentrations $C_1$, $C_2$, $C_3$, $C_4$ to one another, and deducing the presence of leakage of one of the stacks 14A, 14B when one of the following conditions is met:

the difference between two of the concentrations $C_1$, $C_2$, $C_3$, $C_4$ exceeds a predetermined threshold, or the deviation relative to time of the difference between two of the concentrations $C_1$, $C_2$, $C_3$, $C_4$ exceeds a predetermined threshold.

The detection module 61 is suitable for locating the leakage in:

the upstream half of the first stack 14A, if the difference between the concentrations $C_3$ and $C_1$ exceeds a predetermined threshold, or the deviation relative to time of said difference exceeds a predetermined threshold, the concentration $C_3$ being highest, the downstream half of the first stack 14A, if the difference between the concentrations $C_1$ and $C_3$ exceeds a predetermined threshold, or the deviation relative to time of said difference exceeds a predetermined threshold, the concentration $C_1$ being highest, the upstream half of the second stack 14B, if the difference between the concentrations $C_4$ and $C_2$ exceeds a predetermined threshold, or the deviation relative to time of said difference exceeds a predetermined threshold, the concentration $C_4$ being highest, or the downstream half of the second stack 14B, if the difference between the concentrations $C_2$ and $C_4$ exceeds a predetermined threshold, or the deviation relative to time of said difference exceeds a predetermined threshold, the concentration $C_2$ being highest.

The detection module 61 is suitable for locating the cell having the leakage from among the cells 15 of the identified stack half as a function of a delay between a moment $t_0$ (FIG. 6) of brisk variation of one parameter from among the following parameters:
- pressure of the anode stream in the anode channel 30 of the or each cell 15,
- pressure of the cathode stream in the cathode channel 32 of the or each cell 15,
- flow rate of the anode stream in the anode channel 30 of the or each cell 15,
- flow rate of the cathode stream in the cathode channel 32 of the or each cell 15, and
- intensity of the current exchanged between the two sides of the membrane 22 of the or each cell 15, and a moment $t_1$ (FIG. 6) of significant variation of the concentration:
- $C_1$, if the leakage has been detected as being in the downstream half of the first stack 14A,
- $C_2$, if the leakage has been detected as being in the downstream half of the second stack 14B,
- $C_3$, if the leakage has been detected as being in the upstream half of the first stack 14A, and
- $C_4$, if the leakage has been detected as being in the upstream half of the second stack 14B.

A method for detecting a leakage using the fuel cell system 12 according to the fourth embodiment will now be described, in light of FIGS. 5 to 7.

According to this method, the stacks 14A, 14B are supplied with a cathode stream and an anode stream. For each cell 15 of each stack 14A, 14B:
- the anode stream flows at a first flow rate in the anode channel 30, at a first pressure,
- the cathode stream flows at a second flow rate in the cathode channel 32, at a second pressure, and
- a current of the first intensity is exchanged between the two sides of the membrane 22, said first intensity being greater than or equal to zero.

In a first step for monitoring the fuel cell system 12, the sensor 60 measures the concentrations $C_1$, $C_2$, $C_3$, $C_4$ at the corresponding measuring points. To that end, the multi-channel valve 92 successively connects each inlet 94A, 94B, 94C, 94D to the outlet 94E, at constant time intervals.

The detection module 61 determines the evolution over time of each concentration $C_1$, $C_2$, $C_3$, $C_4$ as well as the differences between those concentrations in pairs.

The detection module 61 determines the presence of a leakage in one of the stacks 14A, 14B when one of the following conditions is met:
- the difference between two of the concentrations $C_1$, $C_2$, $C_3$, $C_4$ exceeds a predetermined threshold, or
- the deviation relative to time of the difference between two of the concentrations $C_1$, $C_2$, $C_3$, $C_4$ exceeds a predetermined threshold.

When a leakage is thus detected, a second step for locating the leakage is carried out following the first monitoring step. During the second step, the detection module 61 locates the stack half in which the leakage is located based on the condition set out above that has been met. The detection module locates the leakage in:
- the upstream half of the first stack 14A, if the difference between the concentrations $C_3$ and $C_1$ exceeds a predetermined threshold, or the deviation relative to time of said difference exceeds a predetermined threshold, the concentration $C_3$ being highest,
- the downstream half of the first stack 14A, if the difference between the concentrations $C_1$ and $C_3$ exceeds a predetermined threshold, or the deviation relative to time of said difference exceeds a predetermined threshold, the concentration $C_1$ being highest,
- the upstream half of the second stack 14B, if the difference between the concentrations $C_4$ and $C_2$ exceeds a predetermined threshold, or the deviation relative to time of said difference exceeds a predetermined threshold, the concentration $C_4$ being highest, or
- the downstream half of the second stack 14B, if the difference between the concentrations $C_2$ and $C_4$ exceeds a predetermined threshold, or the deviation relative to time of said difference exceeds a predetermined threshold, the concentration $C_2$ being highest.

Figure 7:
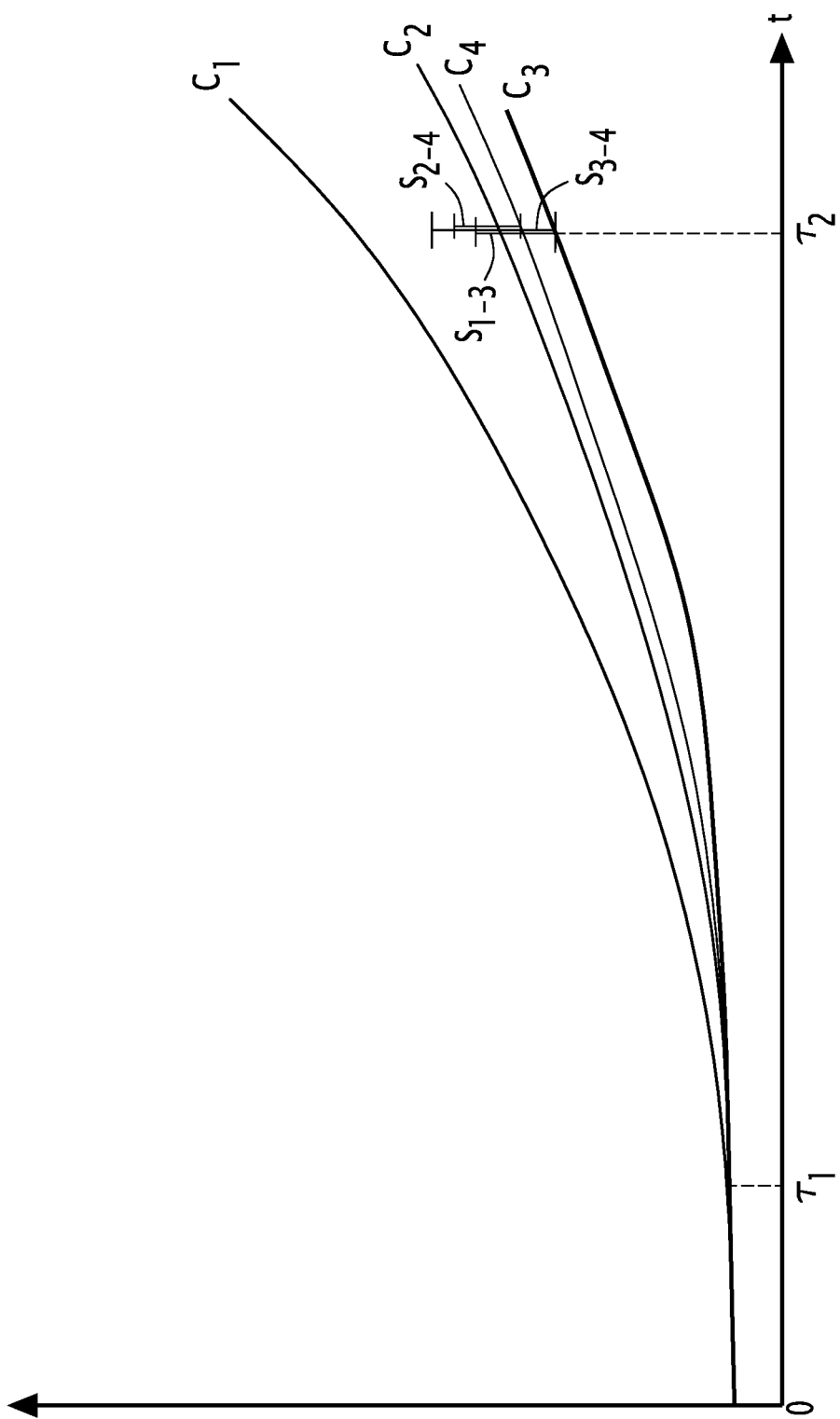
FIG. 7 is a graph illustrating the evolutions over time of four measured reducing fluid concentrations.

In the example shown in FIG. 7, at a first measuring moment $\tau 1$, the concentrations $C_1$, $C_2$, $C_3$, $C_4$ are all substantially equal. The detection module 61 therefore concludes that there is no leakage at moment $\tau_1$. However, at a second measuring moment $\tau_2$, it is observed that the difference between the concentrations $C_1$ and $C_3$ is above a predetermined threshold $S_{1-3}$, the concentration $C_1$ being the highest, while the difference between the concentrations $C_3$ and $C_4$ is below a predetermined threshold $S_{3-4}$, and the difference between the concentrations $C_2$ and $C_4$ is below a predetermined threshold $S_{2-4}$. The detection module 61 therefore concludes that there is a leakage in the downstream half of the first stack 14A.

Following the second step for locating the leakage, there is a third step for identifying the leaking cell 15. During this step, the multi-channel valve 92 fluidly connects, to the sensor 60, the measuring point that corresponds to the stack half in which the leakage has been located, to measure the concentration of interest continuously and to individually locate the cell 15 with the leakage.

In particular, the multi-channel valve 92 connects, to the sensor 60:
- the second measuring point of the first stack 14A if the leakage is located in the upstream half of the first stack 14A, to measure the concentration $C_3$,
- the first measuring point of the first stack 14A if the leakage is located in the downstream half of the first stack 14A, to measure the concentration $C_1$,
- the second measuring point of the second stack 14B if the leakage is located in the upstream half of the second stack 14B, to measure the concentration $C_4$,
- the first measuring point of the second stack 14B if the leakage is located in the downstream half of the second stack 14B, to measure the concentration $C_2$.

In the cited example, the multi-channel valve 92 therefore connects the sensor 60 to the first measuring point of the first stack 14A.

At least one parameter is then varied briskly and in a controlled manner, in the stack in which the leakage is detected (i.e., in the cited example, the first stack 14A), at a moment $t_0$, said parameter being chosen from among the following parameters:
- pressure of the anode stream in the anode channel 30 of the or each cell 15;
- pressure of the cathode stream in the cathode channel 32 of the or each cell 15,
- flow rate of the anode stream in the anode channel 30 of the or each cell 15;

flow rate of the cathode stream in the cathode channel 32 of the or each cell 15; to that end, the recirculation pump 57 is for example activated; and intensity of the current exchanged between the two sides of the membrane 22 of the or each cell 15.

Preferably, at least two parameters are varied simultaneously or sequentially from among the preceding parameters.

Figure 6:
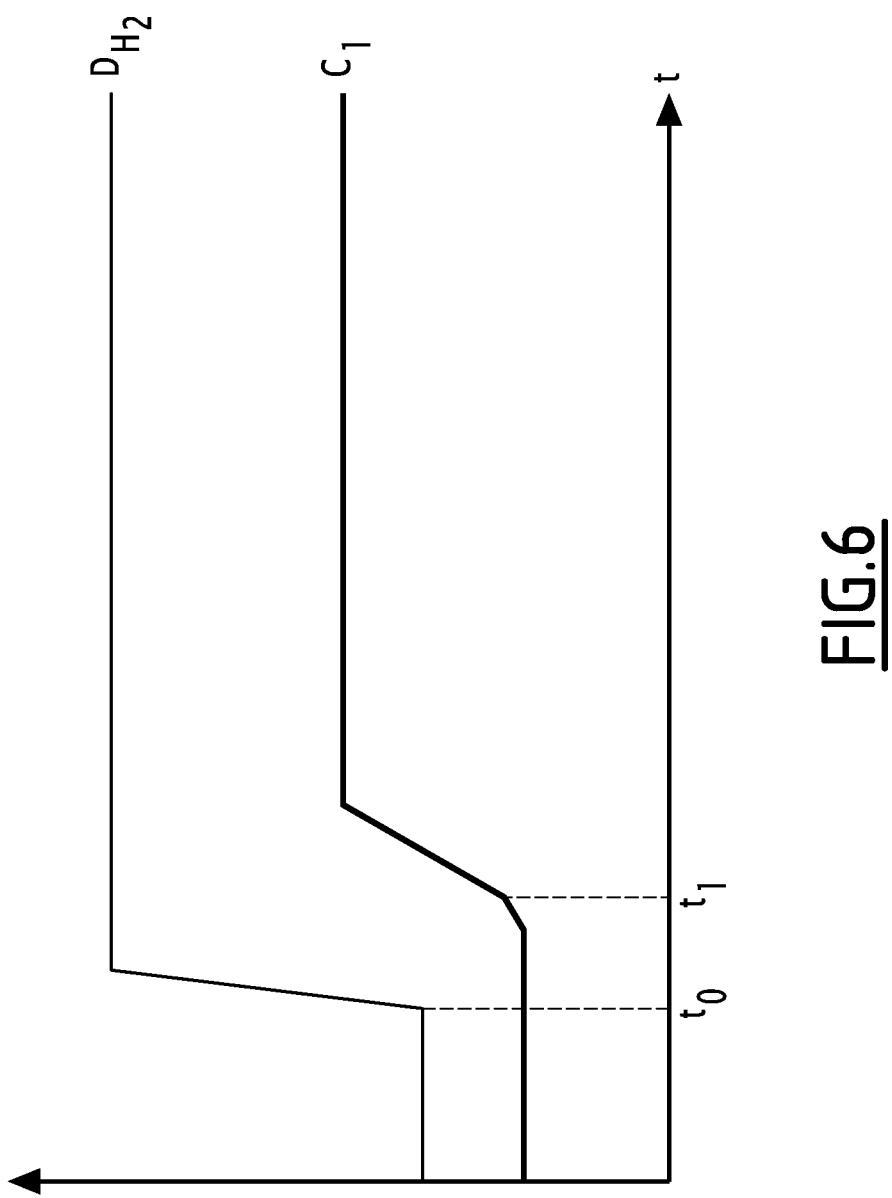
FIG. 6 is a graph showing the evolution over time of an anode stream flow rate in a stack of cells of the system of FIG. 3, and a measured reducing fluid concentration.

In the example shown in FIG. 6, it is the flow rate of the anode stream that varies. In reference to that Figure, the detection module 61 identifies the cell having the leakage among the cells 15 of the identified stack half as a function of the delay between the moment $t_0$ and a moment $t_1$ of the significant variation of the concentration of interest, namely:

$C_1$, if the leakage has been detected as being in the downstream half of the first stack 14A, $C_2$, if the leakage has been detected as being in the downstream half of the second stack 14B, $C_3$, if the leakage has been detected as being in the upstream half of the first stack 14A, and $C_4$, if the leakage has been detected as being in the upstream half of the second stack 14B.

Thus, if the moment $t_1$ is close to the moment $t_0$, the detection module 61 identifies the leaking cell 15 as being close to the upstream end of the stack 14A, 14B, and if the moment $t_1$ is far from the moment $t_0$, the detection module 61 identifies the leaking cell 15 as being close to the downstream end of the stack 14A, 14B. One skilled in the art will know how to calibrate the detection module 61 so as to precisely identify the cell 15 affected by the leak as a function of the delay observed between the moments $t_0$ and $t_1$.

It will be noted that this method is easy to adapt to the fuel cell system according to the third embodiment of the invention, illustrated in FIG. 4. To that end, the monitoring step is simply modified such that the valve 84 successively connects each inlet 88A, 88B to the outlet 88C, at constant time intervals, so that the first sensor 60 measures the first and third concentration $C_1$, $C_3$, and the valve 88 successively connects each inlet 90A, 90B to the outlet 90C, at constant time intervals, so that the second sensor 80 measures the second and fourth concentrations $C_2$, $C_4$, and the step for identifying the leaking cell 15 is simply modified so that the valve 84, 86, respectively, corresponding to the stack 14A, 14B, respectively, in which the leakage has been located fluidly connects the associated sensor 60, 80 to the measuring point that corresponds to the stack half in which the leakage has been located.

The method can also be easily adapted to the fuel cell system according to the second embodiment of the invention, illustrated in FIG. 3. To that end, the steps regarding the permutations of the valve 92 are simply eliminated, and the detection of a leakage is simply done by comparing the first and second concentrations $C_1$, $C_2$.

The leakage detection method implemented using the fuel cell system according to the first embodiment of the invention, illustrated in FIGS. 1 and 2, is different from the preceding method. In fact, this method begins with a step for varying, briskly and in a controlled manner, in at least one of the stacks 14A, 14B, at a moment $t_0$, at least one parameter from among the following parameters:

pressure of the anode stream in the anode channel 30 of the or each cell 15;

pressure of the cathode stream in the cathode channel 32 of the or each cell 15, flow rate of the anode stream in the anode channel 30 of the or each cell 15;

flow rate of the cathode stream in the cathode channel 32 of the or each cell 15; to that end, the recirculation pump 57 is for example activated; and intensity of the current exchanged between the two sides of the membrane 22 of the or each cell 15.

Preferably, at least two parameters among the preceding parameters vary simultaneously or sequentially during this step.

This brisk variation increases the permeation rate of the reducing fluid through the membrane 22 of each cell 15. Each sensor measures the reducing fluid concentration in the cathode stream leaving the associated cell 15, and the detection module 61 compares the measured concentrations in pairs, as well as their respective evolutions over time.

The detection module 61 detects the presence of a leakage of one of the cells 15 when one of the following conditions is met:

one of the measured concentrations exceeds the average of the measured concentrations by a predetermined threshold, or the deviation relative to time of the difference between one of the measured concentrations and the average of the measured concentrations exceeds a predetermined threshold, said measured concentration being higher than the average of the measured concentrations.

The detection module 61 identifies the leaking cell 15 as being the cell 15 in which said concentration was measured.

Owing to embodiments of the invention, the leakage detection method, which uses an brisk variation of a relevant parameter combined with a concentration measurement of a stream of reducing fluid, makes it possible to identify leakages, even small ones, in a membrane of an electrochemical cell.

Furthermore, the detection method makes it possible to detect a leakage in a stack of electrochemical cells, and to next precisely and individually detect the or each electrochemical cell exhibiting the leakage.

The method may be implemented reliably and precisely on a simple fuel cell system. In particular, the method makes it possible to identify an electrochemical cell having a leakage from among the electrochemical cells of one or more stacks with a reduced number of reducing fluid concentration sensors in a fluid, in particular with a single sensor.

What is claimed is:

1. A method for detecting leakage of a reducing fluid throughout electrolyte membranes of a stack of electrochemical cells, each membrane being interposed between an anode channel for the flow of an anode stream including the reducing fluid along a first side of the membrane, and a cathode channel for the flow of a cathode stream including the oxidizing fluid along a second side of the membrane, an electric circuit being provided for the flow of electric current between the two sides of the membrane of each of the electrochemical cells, the method including the following successive steps:

supplying the cell with the anode and cathode streams, the anode stream being at a first pressure and flowing at a first flow rate in the anode channel, the cathode stream being at a second pressure and flowing at a second flow rate in the cathode channel, and a current with a first intensity being exchanged between the two sides of the membrane;

varying at least one controlled parameter briskly and in a controlled manner, the controlled parameter being chosen from among the following parameters:

pressure of the anode stream in the anode channel, pressure of the cathode stream in the cathode channel,
flow rate of the anode stream in the anode channel,
flow rate of the cathode stream in the cathode channel, and
intensity of the current exchanged between the two sides of the membrane;

measuring, in response to the varying of the at least one controlled parameter briskly and in the controlled manner, a first reducing fluid concentration in a first stream comprising the cathode stream leaving the cathode channel;

deducing a presence or absence of a leakage based on an evolution over time of the first reducing fluid concentration, wherein the cathode stream leaving each of the electrochemical cells is collected in a cathode collector shared by the electrochemical cells, the first reducing fluid concentration in the first stream being measured at a first measuring point of the cathode collector, the deducing of presence or absence of the leakage including deducing the presence of the leakage of the membrane in the stack based on an evolution over time of the first reducing fluid concentration measured at the first measuring point of the cathode collector, the method further comprising locating a location of the leakage in the stack based on a delay between a moment of the brisk variation of the controlled parameter and a moment of a significant variation of the first reducing fluid concentration at the first measuring point of the cathode collector.

2. The detection method as recited in claim 1 wherein the first stream consists of the cathode stream leaving the cathode channel.

3. The detection method as recited in claim 1 further comprising the following steps:
measuring a second reducing fluid concentration in a second stream flowing at a second measuring point of the cathode collector;
comparing the first reducing fluid concentration and the second reducing fluid concentration to one another; and
locating the leakage among the cells of the stack depending on the variation over time of the first and second reducing fluid concentrations relative to one another.

4. The detection method as recited in claim 3 wherein the second measuring point is positioned upstream from the cell in which the leakage is detected, relative to a fluid flow direction in the cathode collector.

5. The detection method as recited in claim 1 wherein the stack of electrochemical cells is part of a fuel cell system comprising the stack, a multi-channel valve and a dihydrogen sensor, the method further comprising the following steps:
placing a first inlet channel of the multi-channel valve, fluidly connected to the first measuring point, in fluid communication with an outlet channel of the multi-channel valve, fluidly connected to the dihydrogen sensor; and then
measuring the first reducing fluid concentration using the dihydrogen sensor.

6. The detection method as recited in claim 5 further comprising the following steps:

placing a second inlet channel of the multi-channel valve, fluidly connected to the second measuring point, in fluid communication with the outlet channel of the multi-channel valve; and then
measuring the second reducing fluid concentration using the dihydrogen sensor.

7. The detection method as recited in claim 5 wherein the fuel cell system comprises a second stack of electrochemical cells, the method further comprising the following steps:
placing a third inlet channel of the multi-channel valve, fluidly connected to a cathode collector of the second stack, in fluid communication with the outlet channel of the multi-channel valve; and then
measuring, using the dihydrogen sensor, a third reducing fluid concentration in a third stream flowing in the cathode collector of the second stack.

8. The detection method as recited in claim 1 wherein the brisk variation of the flow rate of the cathode stream in the cathode channel is obtained by reinjecting a part of the cathode stream exiting the electrochemical cell at the inlet of the cathode channel.

9. The detection method as recited in claim 1 wherein, during the brisk variation step, at least two of the parameters vary simultaneously or sequentially.

10. The detection method according to claim 1, wherein, when varying at least one controlled parameter briskly and in a controlled manner, the deviation relative to time, over a length of time greater than or equal to 1 second, of the parameter in question is greater than:
10 mbar per second or 1% of the nominal anode pressure per second, for the pressure of the anode stream,
10 mbar per second or 1% of the nominal cathode pressure per second, for the pressure of the cathode stream,
1% of the nominal anode flow rate per second, for the flow rate of the anode stream,
1% of the nominal cathode flow rate per second, for the flow rate of the cathode stream, or
1% of the nominal charge current per second, for the intensity of the current.

11. The detection method according to claim 1, wherein, when varying at least one controlled parameter briskly and in a controlled manner, the deviation relative to time, over a length of time greater than or equal to 1 second, of the parameter in question is greater than:
100 mbar per second or 1% of the nominal anode pressure per second, for the pressure of the anode stream, or
100 mbar per second or 1% of the nominal cathode pressure per second, for the pressure of the cathode stream,
1% of the nominal anode flow rate per second, for the flow rate of the anode stream,
1% of the nominal cathode flow rate per second, for the flow rate of the cathode stream, or
1% of the nominal charge current per second, for the intensity of the current.

12. The method as recited in claim 1 wherein the locating of the location of the leakage in the stack includes determining which of the electrochemical cells of the stack includes the leakage.

* * * * *